United States Patent

Onoda

[11] Patent Number: 5,859,476
[45] Date of Patent: Jan. 12, 1999

[54] MULTI-LAYER WIRING STRUCTURE HAVING NARROWED PORTIONS AT PREDETERMINED LENGTH INTERVALS

[75] Inventor: Hiroshi Onoda, Tokyo, Japan

[73] Assignee: Oki Electric Industry Co., Ltd., Tokyo, Japan

[21] Appl. No.: 113,665

[22] Filed: Aug. 31, 1993

Related U.S. Application Data

[63] Continuation of Ser. No. 851,294, Mar. 12, 1992, abandoned.

[30]    Foreign Application Priority Data

Mar. 12, 1991 [JP] Japan .................................. 3-070324

[51] Int. Cl.$^6$ .................................................. H01L 29/06
[52] U.S. Cl. ........................ 257/775; 257/758; 257/770; 257/767
[58] Field of Search .................... 257/763, 773, 257/775, 751, 765, 764, 382–384

[56]         References Cited

U.S. PATENT DOCUMENTS

| | | | |
|---|---|---|---|
| 4,556,897 | 12/1985 | Yorikane et al. ........................ | 257/765 |
| 4,847,674 | 7/1989 | Sliwa et al. .............................. | 257/775 |
| 4,849,363 | 7/1989 | Coffey et al. .............................. | 437/19 |
| 4,887,146 | 12/1989 | Hinode ..................................... | 257/915 |
| 4,897,709 | 1/1990 | Yokoyama et al. ...................... | 257/751 |
| 4,898,840 | 2/1990 | Okuyama ................................. | 257/203 |
| 4,910,580 | 3/1990 | Kuecher et al. ......................... | 257/915 |
| 4,941,031 | 7/1990 | Kumagai et al. ........................ | 257/758 |
| 4,974,048 | 11/1990 | Chakravorty et al. ................... | 357/40 |
| 4,985,750 | 1/1991 | Hoshino ................................... | 257/751 |
| 5,049,975 | 9/1991 | Ajika et al. .............................. | 257/763 |
| 5,070,392 | 12/1991 | Coffey et al. ............................. | 357/71 |
| 5,300,756 | 4/1994 | Cordingley ......................... | 219/121.69 |

OTHER PUBLICATIONS

Amazawa et al., Selective Growth of Aluminum Using a Novel CVD System, IEDM 88, pp. 442–445, 1988.

*Primary Examiner*—Peter Toby Brown
*Assistant Examiner*—Hung Van Duong
*Attorney, Agent, or Firm*—Jones & Volentine, L.L.P.

[57]            ABSTRACT

A semiconductor device having a laminated wiring layer composed of an Al or Al alloy layer and a high melting point conductive layer, wherein the laminated wiring layer has narrowed portions at which the stress tolerance of the Al or Al alloy is reduced. The controlled breakage of the Al or Al alloy layer at the narrowed portion results in a laminated wiring layer of a predetermined resistance component.

21 Claims, 3 Drawing Sheets

MULTI-LAYER WIRING STRUCTURE HAVING NARROWED PORTIONS AT PREDETERMINED LENGTH INTERVALS

This application is a continuation of application Ser. No. 07/851,294, filed Mar. 12, 1992, and now abandoned.

BACKGROUND OF THE INVENTION

1. Industrial Field of the Invention

The present invention relates to a semiconductor device such as an LSI semiconductor device etc., particularly to a laminated wiring structure on the semiconductor device which is composed of an aluminium or aluminium alloy layer and a high melting point conductive layer.

2. Description of the Related Art

A single layer wiring structure using an Al, Al-Si alloy, Al-Si-Cu alloy, etc. has been employed in a wiring for a semiconductor integrated circuit device.

In order to realize the production of a high integration of semiconductor integrated circuit device, however, a laminated structure using an Al or Al alloy layer and a high melting point conductive layer (e.g. TiN, TiW, WNW, $WSi_2$, $MoSi_2$ etc.) has recently been employed as a wiring layer. This is because the breakage of wire is liable to occur in the single layer wiring structure using an Al or Al alloy alone, due to stress-migration or electro-migration during heat treatment as the wiring layer employs finer wiring and thinner film. A laminated wiring structure composed of an Al or Al alloy layer and a high melting point conductive layer can prevent the failure of the whole semiconductor integrated circuit device, even if the Al or Al alloy layer is broken, since a high melting point conductive layer maintains its electrical conductivity. However, if the Al or Al alloy wirings are broken at uncertain places, irregular variations between the wiring resistance components affect the operating speed and operational timing of the internal circuits. As a result, the entire characteristics of the semiconductor integrated circuit device are deteriorated.

SUMMARY OF THE INVENTION

It is an object of the present invention to provide a semiconductor device having a wiring layer of a predetermined resistance component and capable of eliminating the variation of wiring resistance due to the breaking of an Al or Al alloy layer of a laminated layer at a predetermined position.

The semiconductor device according to the present invention comprises a laminated wiring structure composed of an Al or Al alloy low melting point conductive layer and a high melting point conductive layer, characterized in that the Al or Al alloy wiring layer has narrowed portions at predetermined intervals at which the stress-resistance of the Al or Al alloy is reduced.

A predetermined wiring resistance component is obtained and a variation in wiring resistance component can be restrained by intentionally breaking the Al or Al alloy wiring layers at the narrowed portions.

DESCRIPTION OF THE PREFERRED EMBODIMENT

Figure 1A:
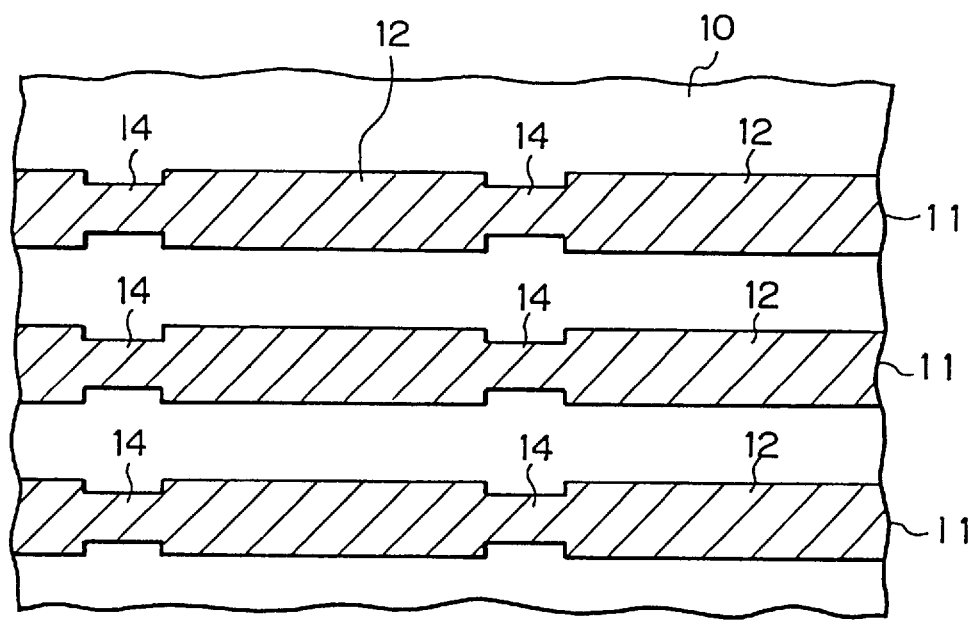
FIG. 1(a) is a plan view showing a laminated wiring structure body which is used in a semiconductor integrated circuit device according to a preferred embodiment of the present invention.
Figure 1B:
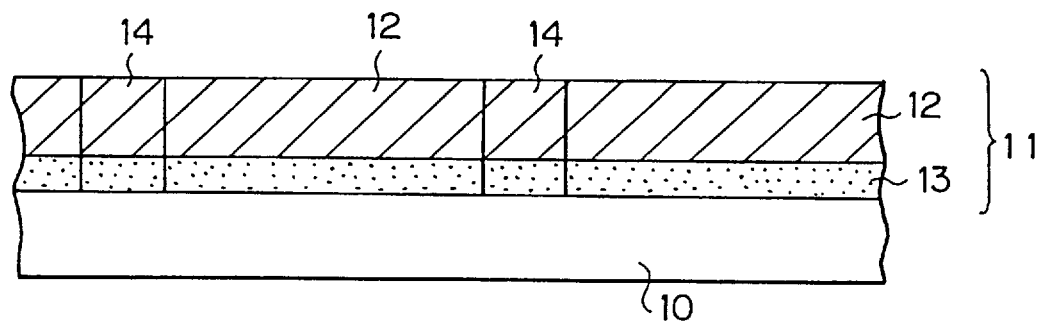
FIG. 1(b) is a cross-sectional view of the laminated wiring structure in FIG. 1(a)

A preferred embodiment of the present invention will be described with reference to FIGS. 1(a), 1(b) and 2, wherein FIG. 1(a) is a plan view and FIG. 1(b) is a cross-sectional view. A wiring 11 formed on a semiconductor substrate 10 comprises an upper layer of a low melting point conductive layer, e.g. an Al layer 12, and a lower layer of a high melting point conductive layer, e.g. a TiN layer 13. For example, the Al layer is 4000 Å thick, and the TiN layer is 1000 Å thick. Their widths are, e.g., about 1 $\mu$m. The wiring has narrowed portions 14 at intervals ranging from 50 to 500 $\mu$m. The width of the narrowed portions is at the most about one half of that of the other portions. The length of the narrowed portions 14 should be as short as possible, e.g. about 0.5 $\mu$m under current lithographic techniques. It is desirable to be as short as possible with the improvement of the lithographic technique.

The narrowed portions are of the Al layer are finally broken or electrically disconnected before the final wafer process is finished. The Al layer is sintered in hydrogen at a temperature of 350° to 400° C. after being subjected to patterning, and the wiring is broken at almost all the narrowed portions due to this heat treatment. The narrowed portions which were not broken in the foregoing processes are completely broken in the heat treatment (400° C. for about 30 min.) during the formation of a passivation film.

When the wiring 11 set forth above is used as the lowest layer wiring of a multi-layer wiring (e.g. 2-layer wiring), an insulating film is formed between the layers at the next step. When the wiring 11 is used as a single layer wiring or an uppermost layer wiring of the multi-layer wiring, a passivation film (last protective insulating film) is formed at the next step. When the wiring 11 is subjected to a heat treatment, e.g., at the time of forming the insulating film, the Al wiring layer is broken at its weak points since the coefficient of linear expansion of Al is 10 times greater than that of the base material such as Si, $SiO_2$, etc. This is because Al increases its volume largely to thereby generate a plastic deformation at high temperature during heat treatment and reduces its volume largely in cooling to thereby generate a heat stress in the Al wiring layer.

Figure 2:
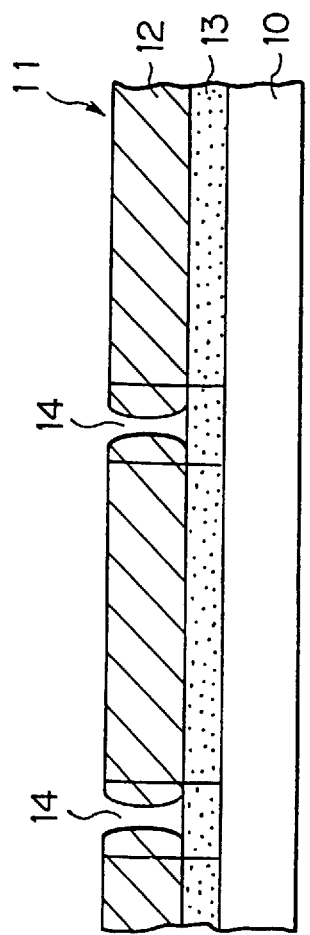
FIG. 2 is a cross-sectional view of the laminated wiring structure in FIG. 1(a) showing breaking of the wiring.

As described in the preferred embodiment, the Al wiring 12 is broken at the narrowed portions 14 which are formed at predetermined intervals as shown in FIG. 2. This is because the strength of the wiring is reduced at the narrowed portions 14. Consequently, the breakage of Al wiring 12 can be localized at weak narrowed portions 14 so as to control the breaking points of the Al wiring 12. Furthermore, inasmuch as the breaking of the wiring at the narrowed portions 14 releases the stress of the wiring, the unintentional breakage of the Al wiring 12 caused by stress- or electro-migration can be restrained so as to always attain a uniform wiring resistance component.

Figure 3:
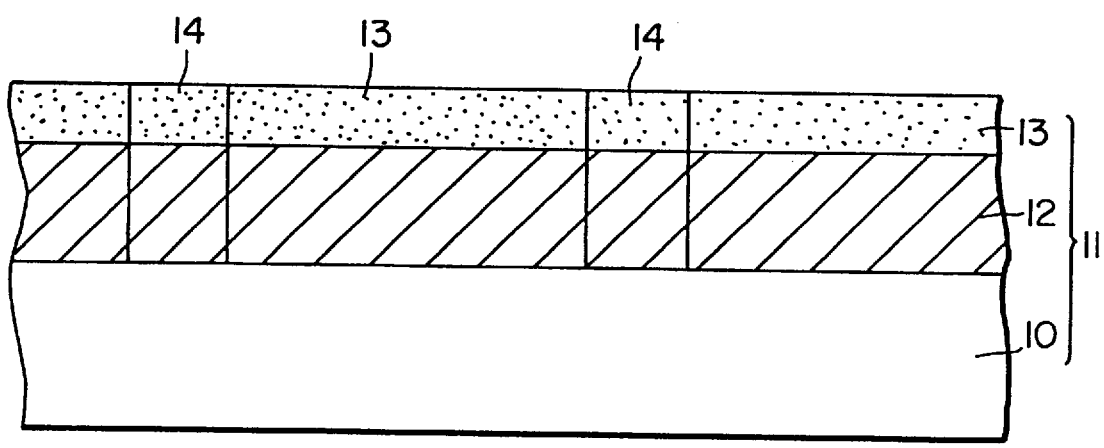
FIG. 3 is also a cross-sectional view of the laminated wiring structure in FIG. 1(a), except that the low melting temperature conductive layer comprising Al is located directly on the semiconductor substrate and the high melting point conductive layer is located on top of the low melting point conductive layer.

FIG. 3 is similar to FIG. 1(b), except that the location of the low melting point conductive layer and the high temperature melting point layer is reversed as indicated therein.

Supposing that the specific resistance factors of Al 12 and TiN 13 are 3 $\mu\Omega$.cm and 100 $\mu\Omega$.cm respectively and the broken gap of the Al wiring is 1 $\mu$m in the case of the laminated wiring of Al/TiN, according to the preferred embodiment, the resistance component increasing rate per each breaking of Al wiring 12 is about 1.5% per each wire of 1 cm length. It is about 1% if the Al wiring 12 is 3000Å thick and about 2% if the Al wiring 12 is 6000Å thick. The increase of the resistance component caused by the wiring breakage can be estimated so that it is possible to design a circuit by incorporating variations in circuit parameters.

Although TiN was employed as the lower layer of the high melting point conductive layer in the preferred embodiment, other high melting point materials such as TiW, WN, W, WSi$_2$, MoSi$_2$, etc. can be employed too. The upper Al layer can be substituted by an Al-Si alloy, an Al-Si-Cu alloy, an Al-Si-Cu-Hf-B alloy, Al-Ti, Al-Pd, Al-Pd-Nb, Al-Sc, Al-Cr-Cu, Al-Cr, Al-Ti-Cu or the like, instead of pure Al. The present invention can be applied to other laminated wiring structures such as those having a high melting point conductive layer on the upper surface of an Al layer, those having high melting point conductive layers on the upper and lower surfaces of the Al layer and those having high melting point conductive layers interlaced with a plurality of Al layers.

What is claimed is:

1. A semiconductor device comprising:
   a semiconductor substrate having a principal surface; and,
   a plurality of multilayer wiring each having a length and a width which extend along and parallel said principal surface of said semiconductor substrates, each of said multilayer wirings including opposite outer side surfaces each extending perpendicular to said principal surface of said semiconductor substrate and parallel to a central longitudinal axis of said each of said multilayer wirings, said opposite outer side surfaces each including opposite recessed outer side surface portions, respectively, said opposite recessed outer side surface portions located at spaced apart predetermined length intervals of each multilayer wiring and being spaced closer to said longitudinal axis than remaining portions of said outer opposite side surfaces which extend between said opposite recessed outer side surface portions, wherein the width of each of said multilayer wirings is decreased at each of said spaced apart predetermined length intervals, the length of each of the recessed portions being less than 0.5 $\mu$m;
   each of said multilayer wirings including a laminate of a first conductive low melting point layer formed of at least aluminum and a second conductive high melting point layer, said laminate extending continuously between said opposite outer side surfaces.

2. A semiconductor device as claimed in claim 1, wherein said first conductive low melting point layer is located between said principal surface of said semiconductor substrate and said second conductive high melting point layer.

3. A semiconductor device as claimed in claim 2, wherein the width of at least one of said multilayer wirings at each of said spaced apart predetermined length intervals is less than half the width of at least one of said multilayer wirings at portions thereof extending between said spaced apart predetermined length intervals.

4. A semiconductor device according to claim 2, wherein said first conductive low melting point layer formed of at least aluminum also includes at least one material selected from the group consisting of Si, Cu, Hf, B, Ti, Pd, Nb, Cr and Sc.

5. A semiconductor device according to claim 2, wherein said second conductive high melting point layer is formed of a high melting point metal alloy.

6. A semiconductor device according to claim 2, wherein said second conductive high melting point layer is formed of a high melting point metal suicide.

7. A semiconductor device according to claim 2, wherein said predetermined length intervals are spaced apart by about 50 to 500 $\mu$m.

8. A semiconductor device according to claim 2, wherein said first conductive low melting point layer formed of at least aluminum is an Al alloy layer.

9. A semiconductor device according to claim 2, wherein said first conductive low melting point layer formed of at least aluminum is a pure Al layer.

10. A semiconductor device comprising:
    a semiconductor substrate having a principal surface; and
    a plurality of multilayer wirings each having a length and a width which extend along and parallel said principal surface of said semiconductor substrate, each of said multilayer wirings including opposite side surfaces each extending perpendicular to said principal surface of said semiconductor substrate, said opposite side surfaces each including recessed portions located at spaced apart predetermined length intervals of each multilayer wiring wherein the width of each of said multilayer wirings is decreased at each of said spaced apart predetermined length intervals, the length of each of the recessed portions being less than 0.5 $\mu$m;
    each of said multilayer wirings including a laminate of a first conductive low melting point layer formed of at least aluminum and a second conductive high melting point layer which is located between said principal surface of said semiconductor substrate and said first conductive low melting point layer.

11. A semiconductor device as claimed in claim 10, wherein the width of at least one of said multilayer wirings at each of said spaced apart predetermined length intervals is less than half the width of at least one of said multilayer wirings at portions thereof extending between said spaced apart predetermined length intervals.

12. A semiconductor device according to claim 10, wherein said first conductive low melting point layer formed of at least aluminum also includes at least one material selected from the group consisting of Si, Cu, Hf, B, Ti, Pd, Nb, Cr and Sc.

13. A semiconductor device according to claim 10, wherein said second conductive high melting point layer is formed of a high melting point metal alloy.

14. A semiconductor device according to claim 10, wherein said second conductive high melting point layer is formed of a high melting point metal silicide.

15. A semiconductor device according to claim 10, wherein said predetermined length intervals are spaced apart by about 50 to 500 $\mu$m.

16. A semiconductor device according to claim 10, wherein said first conductive low melting point layer formed of at least Al is an aluminum alloy layer.

17. A semiconductor device according to claim 10, wherein said first conductive low melting point layer formed of at least aluminum is a pure Al layer.

18. A semiconductor device comprising:
    a semiconductor substrate having a principal surface; and,
    a plurality of multilayer wirings extending lengthwise along a central longitudinal axis thereof, each of said multilayer wirings having a first layer formed on the principal surface of said semiconductor substrate and a second layer formed on the first layer opposite the principal surface of said semiconductor substrate, one of the first and second layers being formed of high melting point conductive material and having a first width, the other of the first and second layers being formed of low melting point conductive material and having a plurality of first parts aligned along said central longitudinal axis and a plurality of second parts aligned along said central longitudinal axis, said plurality of second parts respectively located between said plurality of first parts such that said first parts and second parts are alternately disposed along said central longitudinal axis, each first part having the first width across said central longitudinal axis and a first length along said central longitudinal axis and each second part having a second width across said central longitudinal axis which is smaller than the first width and a second length along said central longitudinal axis which is smaller than the first length.

19. A semiconductor device according to claim 18, wherein the second length is less than 0.5 $\mu$m.

20. A semiconductor device according to claim 18, wherein the first length is about 50 to 500 $\mu$m.

21. A semiconductor device according to claim 18, wherein the second width is less than half of the first width.

* * * * *